TWO-INPUT PULSE SHAPING TRANSISTOR CIRCUIT

Filed May 2, 1966

INVENTORS
EDMUND B. DALY
VERNER K. RICE, Jr.
BY Spencer E. Olson
ATTY.

United States Patent Office 3,419,734
Patented Dec. 31, 1968

3,419,734

TWO-INPUT PULSE SHAPING TRANSISTOR CIRCUIT

Edmund B. Daly, Addison, and Verner K. Rice, Jr., Lombard, Ill., assignors to Automatic Electric Laboratories, Inc., Northlake, Ill., a corporation of Delaware Filed May 2, 1966, Ser. No. 546,894
1 Claim. (Cl. 307—268)

ABSTRACT OF THE DISCLOSURE

A two-transistor logic gate for use with a delay line to reform the pulses propagating therethrough. The base of the first transistor is connected to a first tap of the delay line and the second transistor is connetced to the cathode of a diode whose anode is connected to the collector of the first transistor. A second diode is connected with its cathode to the collector of the second transistor and its anode the collector of the first transistor. This second diode serves to shift the conductive state of the second transistor away from its saturated state upon the termination of the drive to its base.

This invention relates generally to switching or logic circuits to perform logical functions in electronic digital systems, and more particularly to an improved circuit for the shaping of pulses propagating through a delay line.

A logical circuit is frequently defined as a circuit having a plurality of inputs and a single output which is a result of distinctive combinations or permutations of its input signals, to thereby provide a means for the logical discrimination among the combinations of signals. Signals of other combinations than that for which the circuit is designed produce no effect at the output.

Logical circuits have varied applications, and are extensively used in switching and computer circuits for the internal routing of information. Depending on the logic utilized by the associated apparatus, logical circuits may be designed to utilize positive or negative voltages, the type of logic being identified by the polarity of the input variables. Using positive logic, positive signals are considered pertinent; using negative logic, negative signals are considered pertinent.

Certain basic logical circuits, such as "And," "Or," "Inverter circuits" and pulse shapers, for example, are well-known and widely employed in the art to provide designated fundamental logical expressions. More complex logical functions are provided by distinctive combinations of the above-noted basic logical circuits.

The present invention is directed to a high input impedance, desaturating, logic gate used to reconstruct sequential timing pulses from the pulse propagating through a delay line. This circuit generates a positive logic level at its output, when a first input is energized and the second input is not energized. The output transistor is in a nonsaturated state at the start of the pulse to give low storage and very little pulse stretch. When the output pulse terminates, the output transistor is driven hard into saturation to give a short rise time. The output transistor is then caused to relax to the nonsaturated state to be ready for the next input.

Accordingly a feature of this invention is the inclusion of a diode in the collector circuit of the output transistor to force it out of the saturated state to which it is driven.

The above-mentioned and other features and objects of this invention and the manner of attaining them will become more apparent and the invention itself will be better understood from the following description of an embodiment of the invention taken in conjunction with the accompanying drawing, in which.

DETAILED DESCRIPTION

Figure 1:
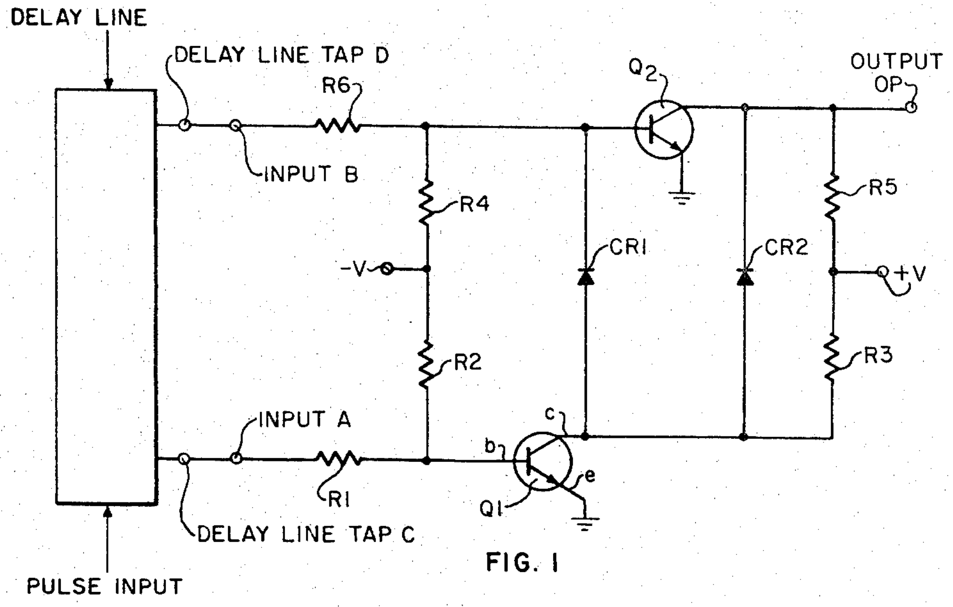
FIG. 1 is schematic of diagram of the pulse forming logic gate.

Referring now to FIG. 1, the principal components of this circuit are transistors Q1 and Q2, level shifting diode CR1, resistors R1 through R6 and anti-saturation diode CR2.

Transistor Q1 has its collector connected to a source of positive voltage +V through resistor R3. Its emitter is connected to ground and the base electrode is connected to a source of negative voltage —V through resistor R2 and to pulse input A through resistor R1. This negative potential on the base of Q1 maintains it in a non-conductive state in the absence of any pulse on the input A.

Transistor Q2 has its collector connected to a source of positive voltage +V through resistor R5, its emitter is connected to ground and the base electrode is connected to a source of negative voltage —V through resistor R4 and to pulse input B through resistor R6. The level shifting diode CR1 connected between the base of Q2 and the collector of Q1, serves to maintain Q2 in a conductive state by supplying base current from the +V source through resistor R3. Transistor Q2 remains conductive with its collector potential equal to its base potential $V_{BE}Q2$.

Anti-saturation diode CR2 is connected between the collector of Q2 and the collector of Q1, which is also the junction of resistor R3 and diode CR1; this prevents the collector of Q2 from becoming negative with respect to the base of transistor Q2. This action prevents the collector-base diode of transistor Q2 from becoming forward biased and causing saturation, when the drive is supplied from resistor R3 only.

Figure 2:
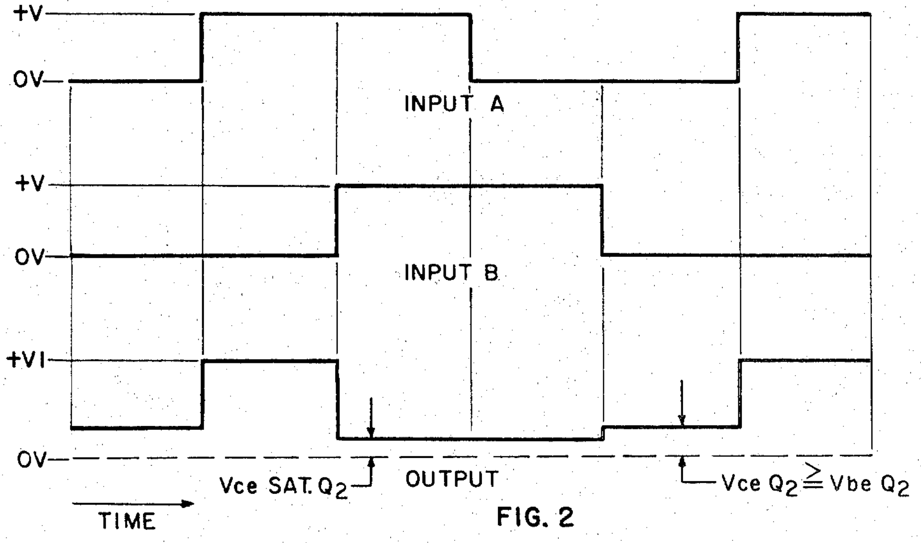
FIG. 2 is a timing diagram showing the inputs and output of the circuit of FIG. 1.

The functions of these components will be more evident from the following description of the sequence of operation of the circuit, and reference to the waveforms of FIG. 2.

In the quiescent state inputs A and B are both off and a zero potential is applied to input resistors R1 and R6. Inputs A and B are connected to successive taps C and D of a delay line. A pulse fed into the delay line will propagate through the line and upon reaching point C connected to input A, it rises to a positive value to turn on transistor Q1 by supplying its base current through resistor R1. When transistor Q1 turns on, it places a ground at the junction of resistor R3 and diode CR1; this removes the forward base current from transistor Q2 and causes it to be biased off through resistor R4 to the source of negative potential —V.

When transistor Q2 is turned off, the output point at its collector rises to the level of the positive voltage source through R5. After a time interval governed by the delay line, input B rises to a positive value +V. Transistor Q2 is now driven into saturation by the base current supplied through resistor R6 and the collector potential falls to $V_{CESAT}$ of Q2 which is a slightly positive 0.2 to 0.6 volt with respect to ground.

Input A returns to its ground level, this, however, has no effect on the circuit; transistor Q2 remains in the saturated state under the control of input B. When input B returns to its ground level and removes the saturating base drive from resistor R6 to the base of transistor R3 and diode CR1, the anti-saturation diode CR2 turns on. When the diode CR2 turns on, the output potential rises slightly to a potential equal to the base emitter potential of transistor Q2. Transistor Q2 is desaturated and is ready for the next input sequence. High input impedance to prevent loading of the delay line is provided by resistors R1 and R6, which in the illustrated embodiment have a magnitude ten times larger than the characteristic impedance of the delay line.

From the foregoing description it should now be apparent that the circuit of the present invention provides a simple and reliable method of translating a pulse that is propagating through a delay into a discrete timing interval. A delay line coupled with this circuit can provide a stable and reliable sequential timing generator. This timing feature lends itself very well to asynchronous pulse generators and could be used in many applications. While a specific embodiment has been illustrated it will be understood that the invention is not so limited but may be extended to a broad class of similar circuits as defined in the appended claim.

What is claimed is:

1. In combination with a signal source capable of successively providing a first and a second input signal upon a first and a second output lead, a pulse forming logic gate comprising: a first and a second transistor each having base, emitter and collector elements, means to apply operating potential to each of said transistor elements including the connection of a reference potential to the emitter element of each transistor to maintain said first transistor in a non-conducting state and said second transistor in a conducting state, a first means applying said first input signal to said first transistor base to cause said first transistor to conduct, a first diode connecting said first transistor collector to said second transistor base, to cause said second transistor to cease conduction upon said first transistor becoming conductive, a second means applying said second input signal to said second transistor base to cause said second transistor to conduct to the extent of saturation, and a second diode connecting said first transistor collector to said second transistor collector to decrease the conductive condition of said second transistor from said saturated state, whereby said second transistor is prepared for a succeeding pulse.

No references cited.

ARTHUR GAUSS, *Primary Examiner.*

S. D. MILLER, *Assistant Examiner.*

U.S. Cl. X.R.

307—208, 265, 269, 293, 300; 328—58